US005081559A

United States Patent [19]

Fazan et al.

[11] Patent Number: 5,081,559
[45] Date of Patent: Jan. 14, 1992

[54] ENCLOSED FERROELECTRIC STACKED CAPACITOR

[75] Inventors: Pierre Fazan; Yauh-Ching Liu; Hiang C. Chan, all of Boise, Id.

[73] Assignee: Micron Technology, Inc., Boise, Id.

[21] Appl. No.: 662,671

[22] Filed: Feb. 28, 1991

[51] Int. Cl.⁵ .................. H01L 29/68; H01G 4/06
[52] U.S. Cl. ........................... 361/313; 357/23.6
[58] Field of Search ..................... 361/311–313; 357/23.6; 365/149; 437/30, 41, 52, 60

[56] References Cited

U.S. PATENT DOCUMENTS

| 5,001,526 | 3/1991 | Gotou | 357/23.6 |
| 5,012,309 | 4/1991 | Nakayama | 357/23.6 |
| 5,023,683 | 6/1991 | Yamada | 357/23.6 |

OTHER PUBLICATIONS

"A Ferroelectric Dram Cell for High-Density NVRAM's", by Reza Moazzami et al., *IEEE Electronic Device Letters*, vol. 11, No. 10, Oct. 1990, pp. 455–456.

*Primary Examiner*—Donald Griffin
*Attorney, Agent, or Firm*—David J. Paul

[57] ABSTRACT

This invention relates to semiconductor circuit memory storage devices and more particularly to a process to develop three-dimensional stacked cell capacitors using a PZT ferroelectric material as a storage cell dielectric for use in high-density dynamic random access memory (DRAM) arrays. The present invention employs using PZT ferroelectric for the storage cell dielectric in three-dimensional stacked capacitor technology and develops an existing stacked capacitor fabrication process to construct a PZT three-dimensional stacked capacitor cell (the EFSC) that will allow denser storage cell fabrication with minimal increases of overall memory array dimensions. A capacitance gain of 3 to 10X or more over that of a conventional 3-dimensional storage cell is gained by using PZT ferroelectric as the storage cell dielectric.

25 Claims, 9 Drawing Sheets

ENCLOSED FERROELECTRIC STACKED CAPACITOR

FIELD OF THE INVENTION

This invention relates to semiconductor circuit memory storage devices and more particularly to a process to develop three-dimensional stacked cell capacitors using a PZT ferroelectric material as a storage cell dielectric for use in high-density dynamic random access memory (DRAM) arrays.

BACKGROUND OF THE INVENTION

In dynamic semiconductor memory storage devices it is essential that the storage node capacitor retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node capacitance in densely packed memory devices is through the use of "stacked storage cell" design. With this technology, two layers of conductive material, such as polycrystalline silicon (polysilicon or poly) are deposited over an access device on a silicon wafer with a dielectric layer sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by Reza Moazzami et al., entitled "A Ferroelectric DRAM Cell for High-Density NVRAM's," *IEEE ELECTRONIC DEVICE LETTERS*, Vol. 11, No. 10, October 1990, pp. 455–456, herein incorporated by reference, discusses the use of a PZT ferroelectric material as a cell dielectric in a planar capacitor.

As discussed on pp. 455 in section B. DRAM Mode, a PZT ferroelectric material has been used as the storage cell's dielectric film. As stated and shown in FIG. 3a, pp. 455, very little degradation was observed in the small-signal capacitance after $10^{10}$ read/write cycles.

The PZT ferroelectric material has a high dielectric constant very favorable for use as a storage cell dielectric, but as discussed in this article PZT has only been used experimentally in planar storage capacitors. The present invention employs using PZT ferroelectric for the storage cell dielectric in three-dimensional stacked capacitor technology and develops an existing stacked capacitor fabrication process to construct a PZT three-dimensional stacked capacitor cell that will allow denser storage cell fabrication with minimal increases of overall memory array dimensions.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional double plate stacked capacitor enclosed by a ferroelectric material, referred to hereinafter as an (E)nclosed (F)erroelectric (S)tacked (C)apacitor or EFSC. The EFSC design defines a capacitor storage cell that in the present invention is used in a DRAM process, however it will be evident to one skilled in the art to incorporate these steps into other processes requiring memory cells such as VRAMs, EPROMs or the like.

After a silicon wafer is prepared using conventional process steps, the present invention develops the EFSC by creating a conductive storage node structure conforming to the wafer's topology formed by two adjacent digit lines running perpendicular to and over the top of three adjacent word lines. A PZT ferroelectric material is used as the storage cell dielectric allowing for increased capacitance while maintaining the surface area required for a conventional 3-dimensional storage cell.

DETAILED DESCRIPTION OF THE PREFERRED EMBODIMENT

The invention is directed to maximizing storage cell capacitance in a high density/high volume DRAM fabrication process, in a sequence shown in FIGS. 1-9.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and can be arranged in interdigitated columns and non-interdigitated rows. The active areas are used to form active MOS transistors that can be doped as NMOS or PMOS type FETs depending on the desired use.

Figure 1:
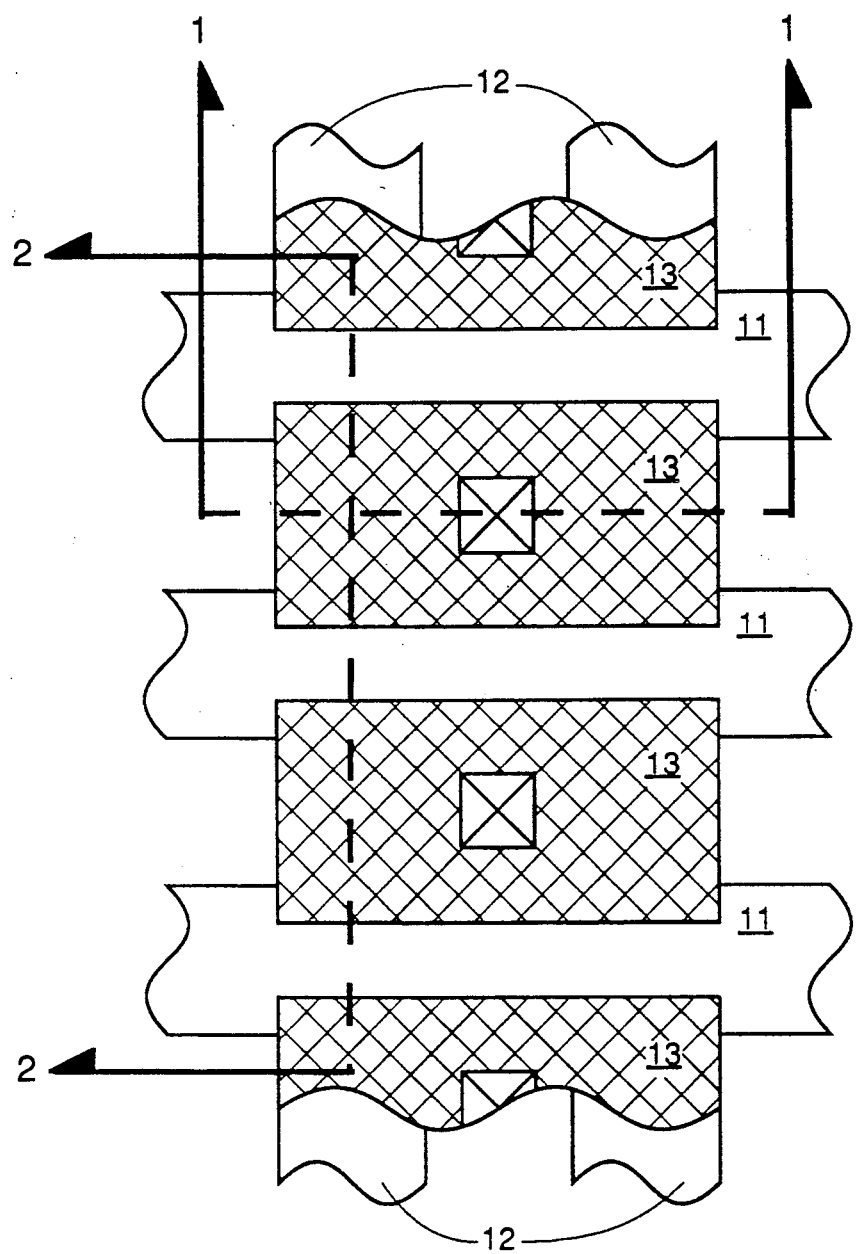
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and a storage node plate 13 of a EFSC.

Figure 2:
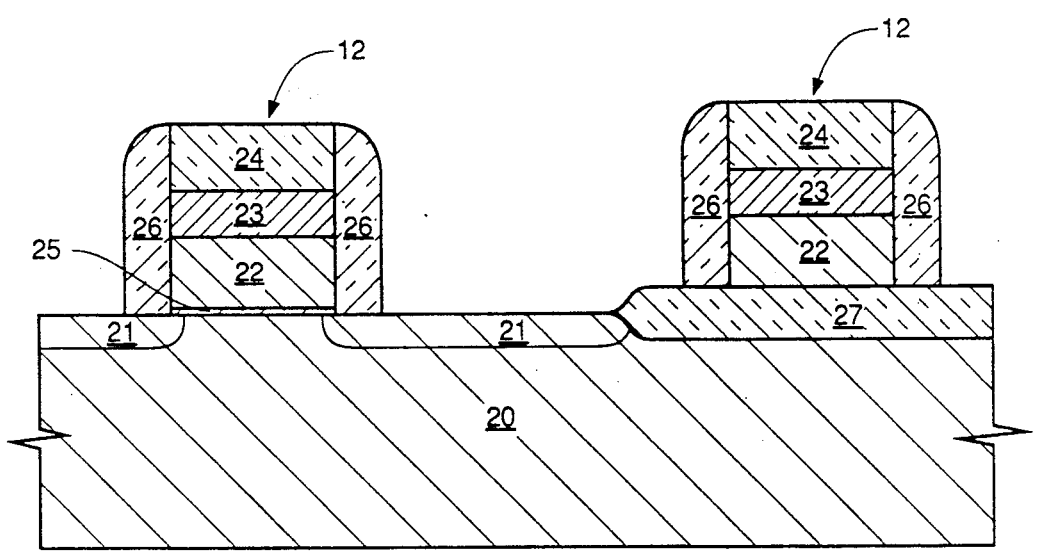
FIG. 2 is a cross-sectional view through broken line 1—1 of FIG. 1.

As shown in FIG. 2, poly 22, covered with silicide 23 and dielectric 24 (either oxide or nitride) are patterned to serve as word lines 12. Word lines 12 are further isolated from one another as well as subsequent conductive layers by dielectric spacers 26 (also either oxide or nitride). Word lines 12 have been previously deposited over a thin layer of gate oxide 25 or a thick layer of field oxide 27. Dielectrics 24 and 26 may be deposited by chemical vapor deposition (CVD). Active areas 21 have been appropriately doped to a desired conductivity type which penetrates into the bulk silicon wafer 20, by conventional process steps. Now the wafer is ready for digit line formation that will run perpendicular to and over word lines 12.

Figure 3:
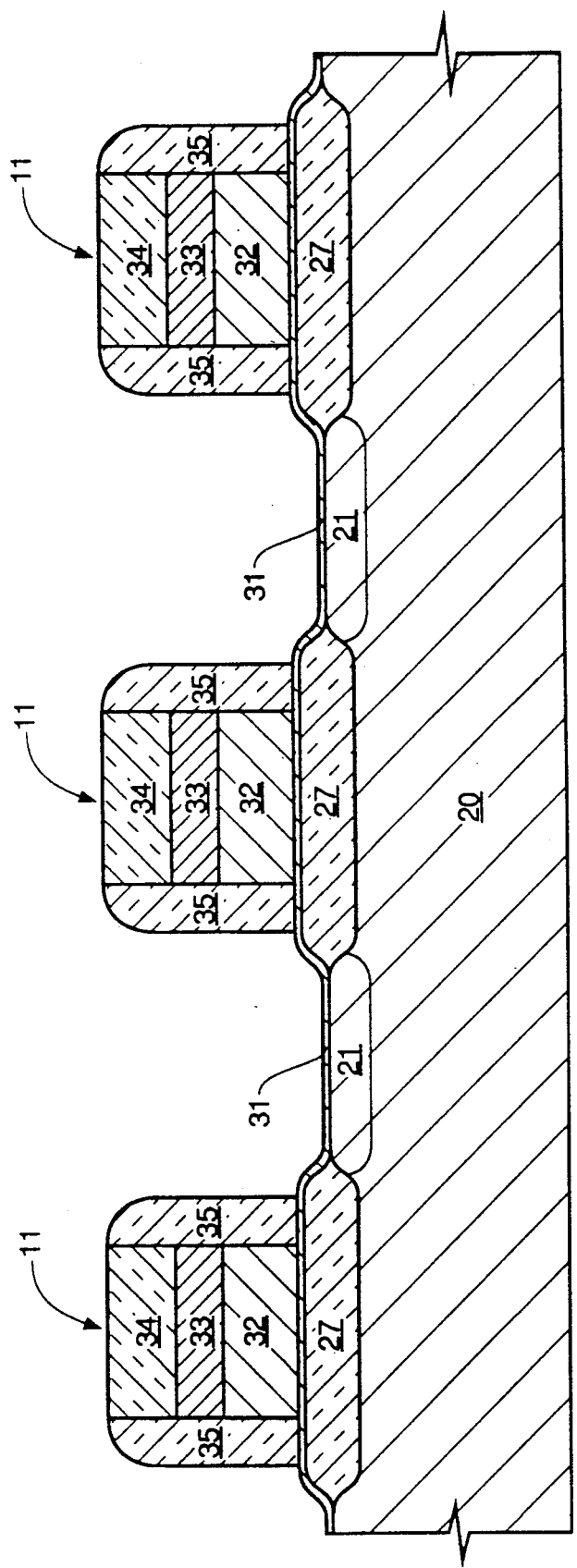
FIG. 3 is a cross-sectional view through broken line 2—2 of FIG. 1.

As shown in FIG. 3, an oxide layer 31 is deposited over the entire wafer array surface followed by buried digit line contacts patterning and etch. The buried digit line contacts cannot be seen, as the cross-sectional view of 2—2 in FIG. 1 does not pass through the buried contacts. Following the etching of a digit line buried contact, blanket depositions of polysilicon 32, silicide 33 and dielectric 34 are performed respectively. Dielectric 34 can be either nitride or oxide and is deposited by chemical vapor deposition (CVD) which is preferred for its excellent conformity. The layers of polysilicon 32, silicide 33 and dielectric 34 are patterned and etched to serve as parallel digit lines 11. Polysilicon 32 has previously been conductively doped to electrically couple with silicide 33 to serve as the conductor for digit lines 11. Digit lines 11 run perpendicular to and over the top of word lines 12 that are shown in FIG. 2 and conform to the wafer surface resulting in a waveform-like topology running in both the digit line and word line directions. A second dielectric, such as nitride or oxide is now deposited (preferably by CVD), followed by an anisotropic etch to form vertical dielectric spacers 35.

Up to this point, process flow has followed that of an array comprising conventional stacked capacitor cells. From this point forward, the process is unique to an array having EFSC-type storage capacitors.

Figure 4:
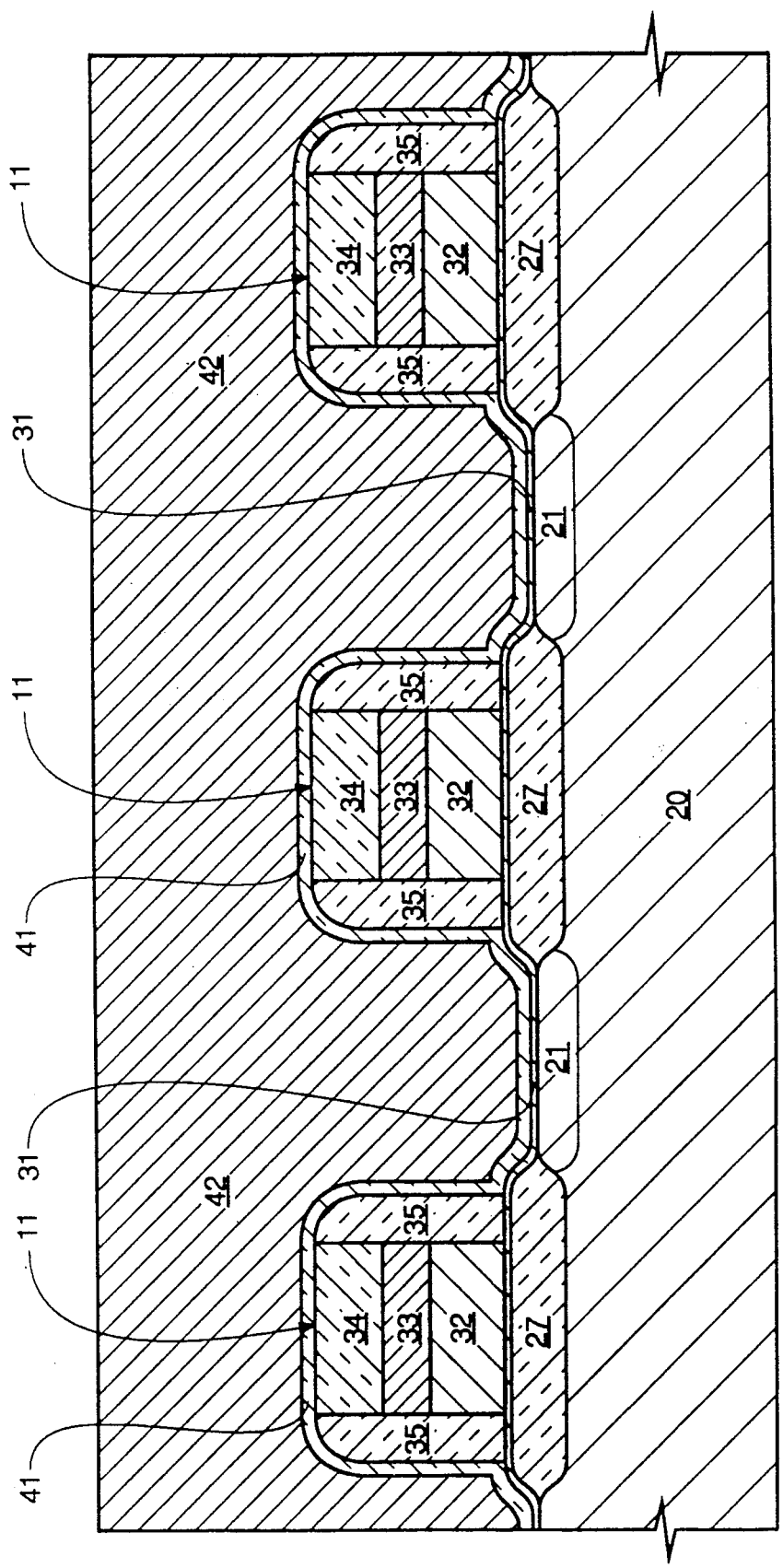
FIG. 4 is a cross-sectional view of the in-process wafer portion of FIG. 3 following a conformal oxide deposition, a conformal tungsten deposition and planarization.

As shown in FIG. 4, digit lines 11 and their subsequent isolation layers are then covered with dielectric 41 to a preferred thickness of 500 to 2000 angstroms preferably by CVD. Dielectric 41 may be either a layer of oxide or nitride. Following dielectric 41 deposition, although not seen in this cross-sectional view, a buried contact to active area 21 is located by coating the wafer surface with a photoresist. Then after applying the appropriate photomask, a buried contact anisotropic etch provides a opening for access to active area 21. Once the buried contact is established a conformal conductive layer 42, such as tungsten of tungsten silicide is deposited thus making contact to active area 21. Conductive layer 42 is then planarized to obtain a flat wafer surface.

Figure 5:
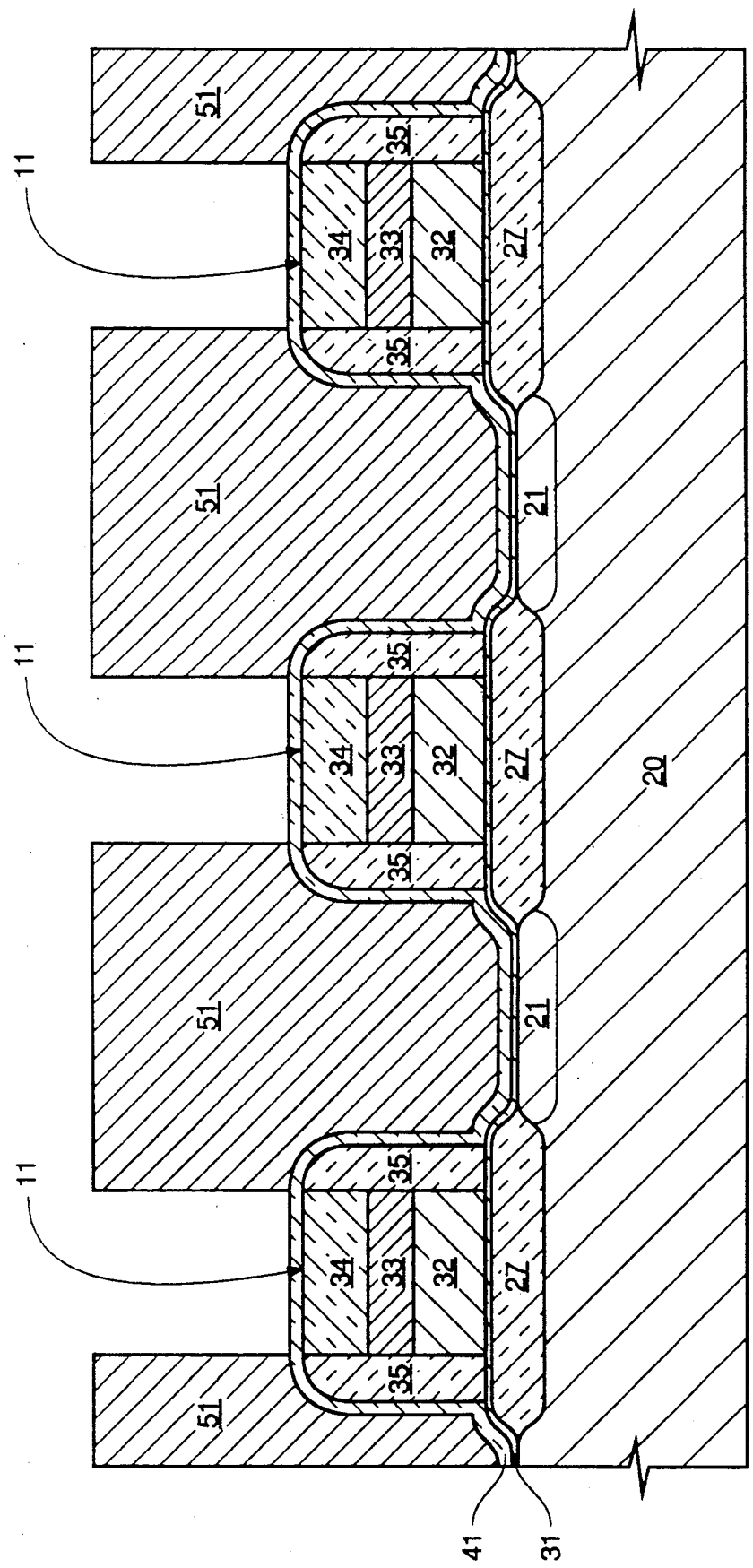
FIG. 5 is a cross-sectional view of the in-process wafer portion of FIG. 4 following patterning and etching of tungsten to form a storage node plate.

As shown in FIG. 5, conductive layer 42 (of FIG. 4) is patterned and etched to form a storage node plate 51 of the EFSC.

Figure 6:
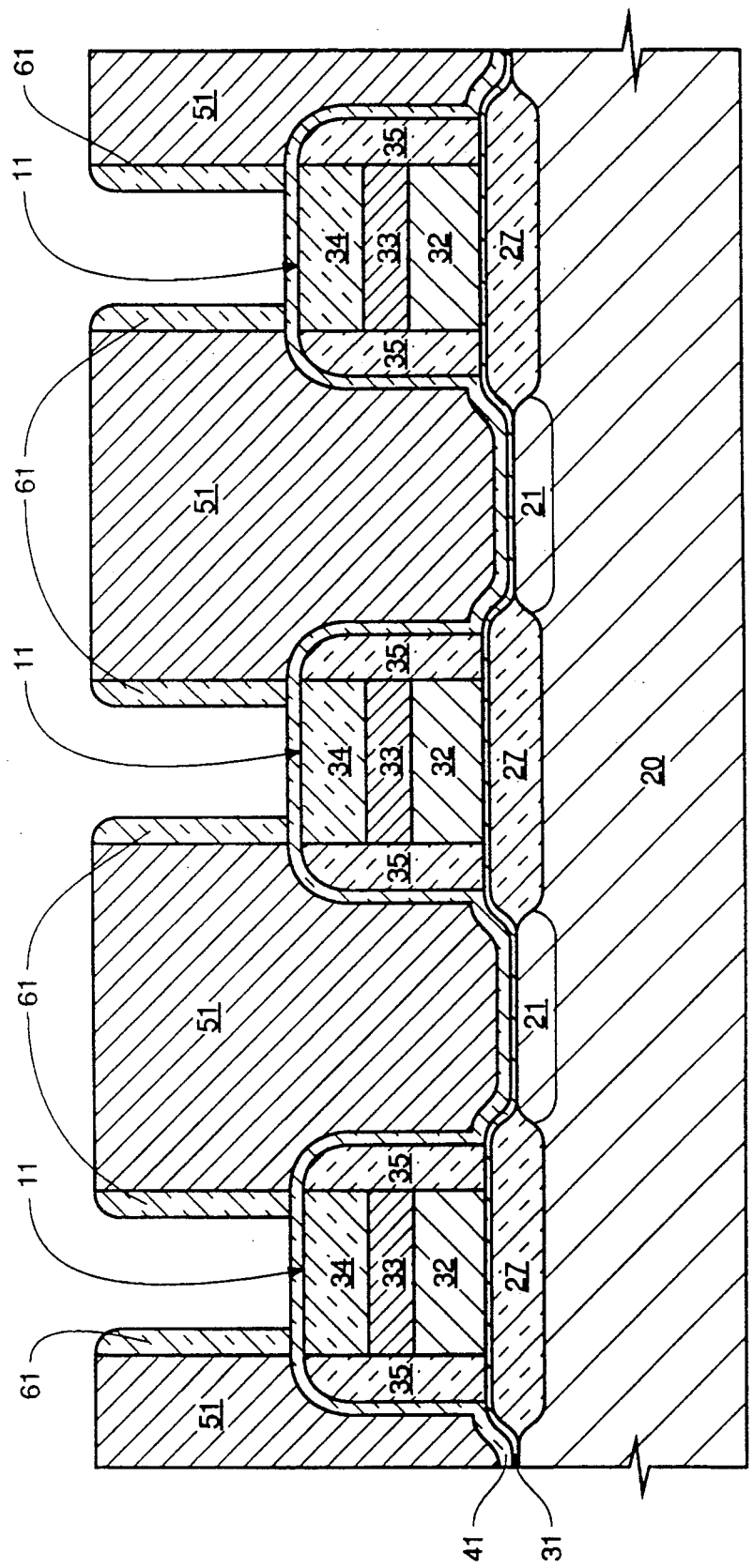
FIG. 6 is a cross-sectional view of the in-process wafer portion of FIG. 5 after a deposition of conformal dielectric followed by a dielectric space etch.

As shown in FIG. 6, a conformal dielectric layer has been deposited followed by an anisotropic etch to create dielectric spacers 61. The dielectric used to form dielectric spacers 61 can be materials such as oxide, nitride or polyimide.

Figure 7:
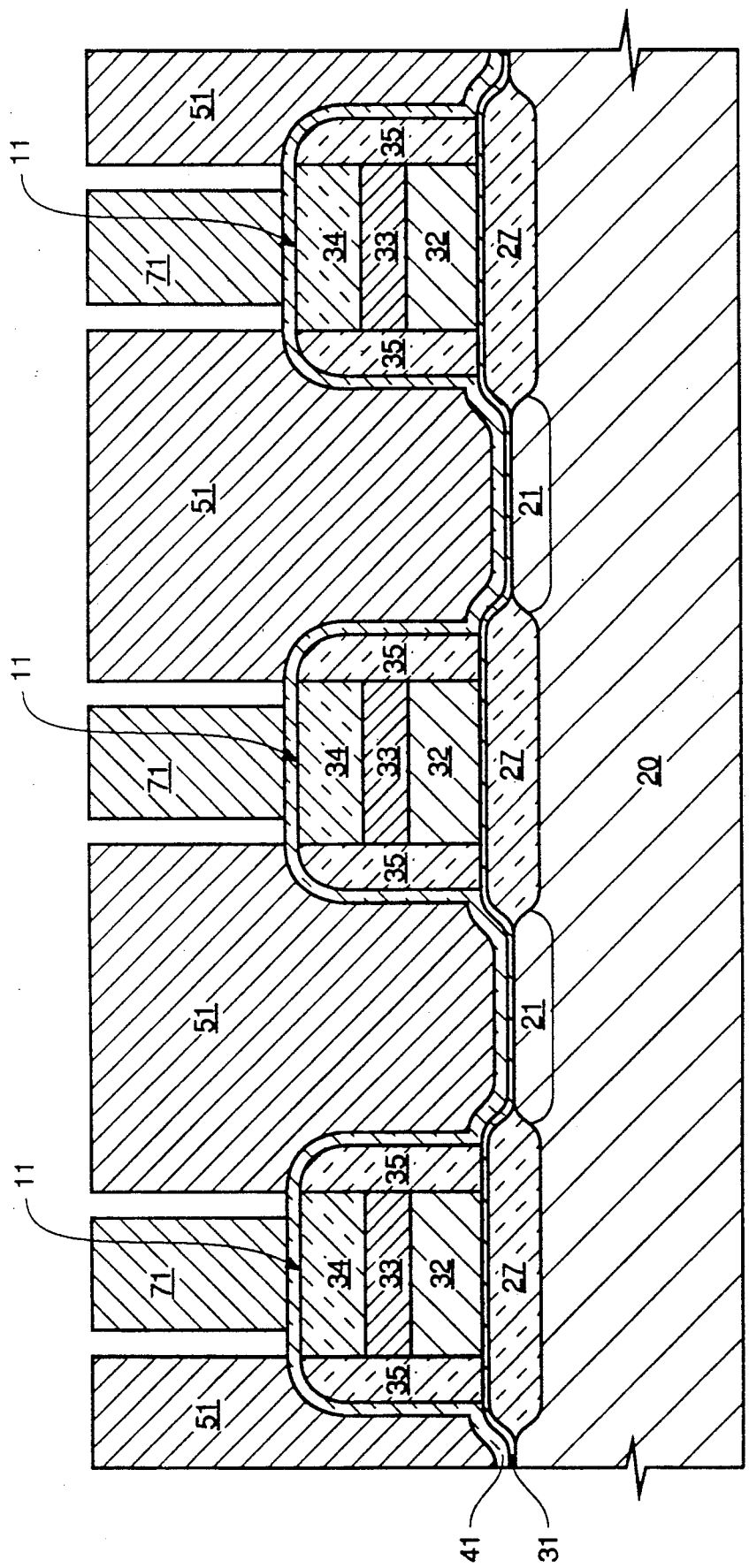
FIG. 7 is a cross-sectional view of the in-process wafer portion of FIG. 6 after a tungsten deposition and planarization followed by removal of the dielectric spacers.

As shown in FIG. 7, a conformal conductive layer is deposited and planarized to form conductive spacers 71. Once again, in the preferred embodiment conductive spacers can be tungsten or tungsten silicide. Following planarization of conductive spacers 71 a controlled isotropic etch is performed to remove the dielectric spacers 61 shown in FIG. 6.

Figure 8:
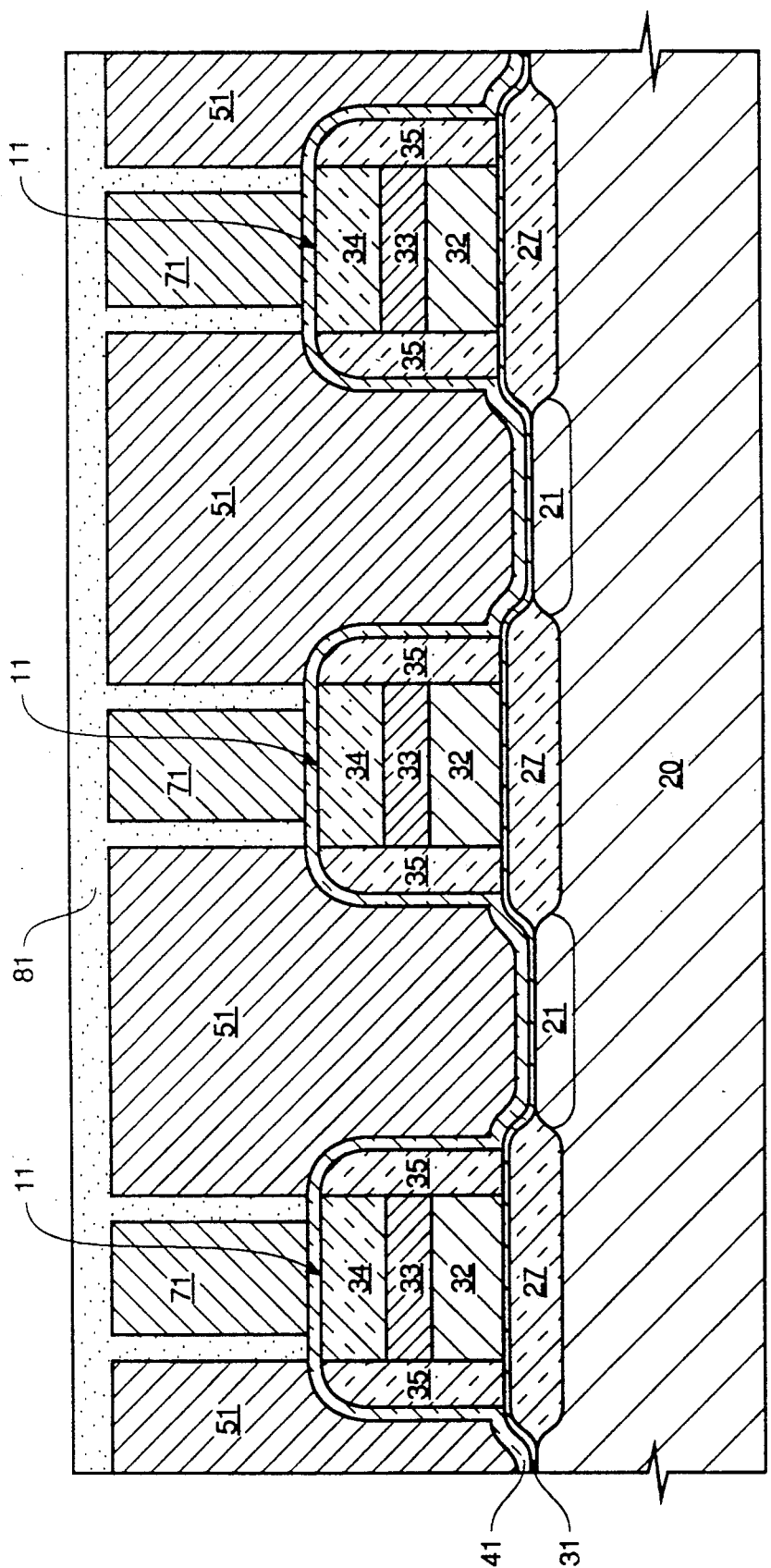
FIG. 8 is a cross-sectional view of the in-process wafer portion of FIG. 7, following deposition of a PZT ferroelectric material.

As shown in FIG. 8, a dielectric material presenting a very high dielectric constant such as a PZT ferroelectric material (lead zirconate titanate or $PbZr_{0.5}Ti_{0.5}O_3$) is then applied preferentially by a sol-gel technique known by one skilled in the art. PZT materials are known to present dielectric constant values 100 to 300 times higher than that of generally used cell dielectrics such as $Si_3N_4$. Using a sol-gel coating or depositing technique allows the PZT material to fill in gaps made by the absence of dielectric spacers 61 (seen in FIG. 6) and cover conductive storage node plate 51 and conductive spacers 71. The PZT material will serve as a cell dielectric 81 for the EFSC by isolating storage node plate 51 from conductive spacers 71 and from a conductive layer to be deposited next.

Figure 9:
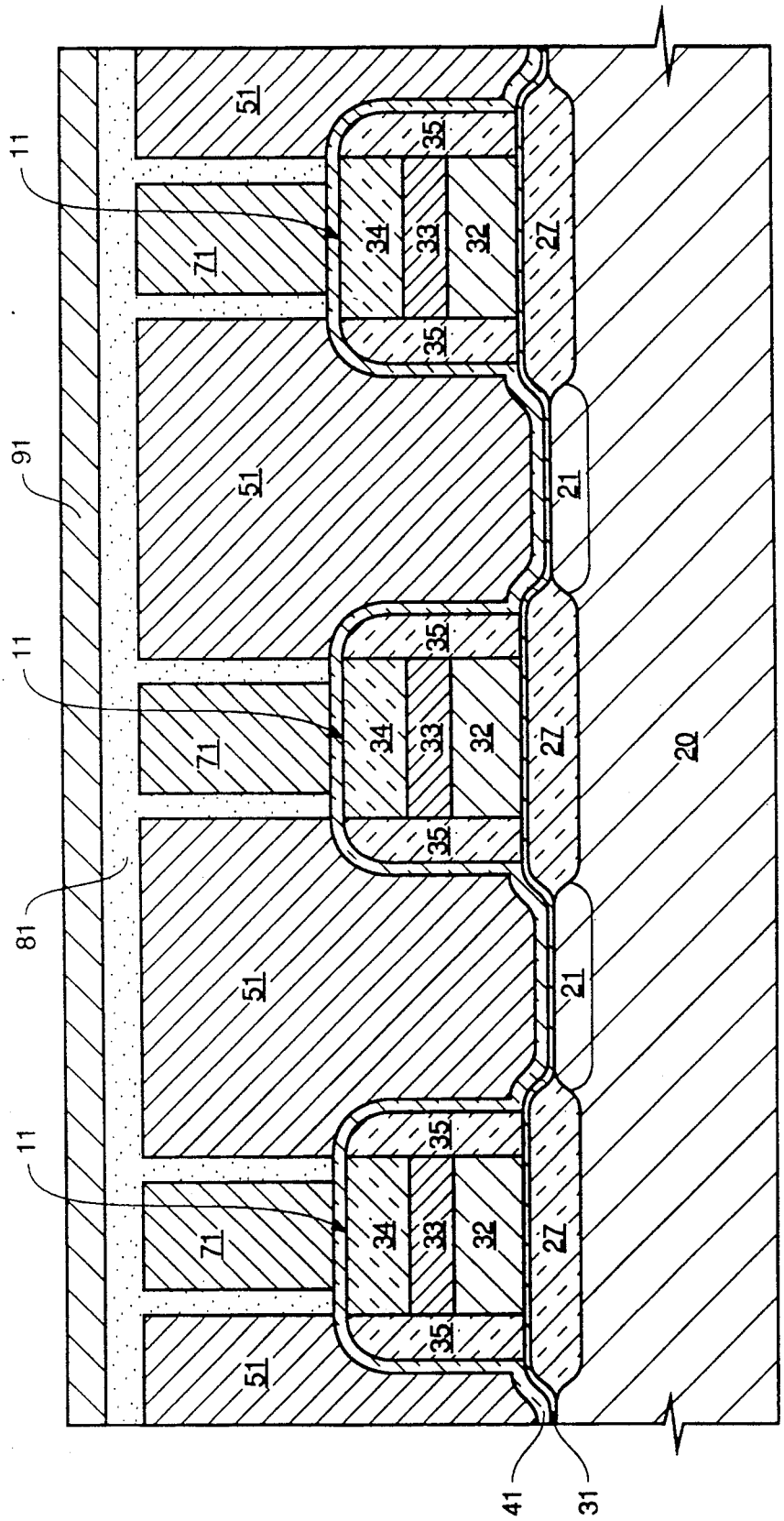
FIG. 9 is a cross-sectional view of the in-process wafer portion of FIG. 8, following a deposition of tungsten, thus completing the EFSC structure.

As shown in FIG. 9, a conformal conductive layer (tungsten or tungsten silicide) is deposited and now serves as one capacitor cell plate 91. Conductive spacers 71 serve as a bottom cell plate by connecting to a top cell plate 91 at the array periphery of the EFSC storage capacitor. Cell plate 91 and conductive spacers 71 form double capacitor cell plates which then become a common cell plate to all EFSC storage capacitors in the array.

With the cell dielectric being PZT material a very high dielectric constant material is utilized thus increasing the storage capability of the storage node cell without increasing the area required for cell construction. This important feature will allow fabrication of similar cell structures using PZT for future generations of memory devices such as 64M and 256M DRAMs.

Throughout the preferred embodiment, tungsten or tungsten silicide is deposited to serve as conductive capacitor plates, however many materials that possess conductive qualities which can be deposited or sputtered, may be used in place of the tungsten or tungsten silicide if so desired. It is therefore, to be understood that although the present invention has been described with reference to a preferred embodiment, various modifications, known to those skilled in the art, may be made to the structures and process steps presented herein without departing from the invention as recited in the claims appended hereto.

We claim:

1. A storage capacitor constructed on a silicon substrate, said capacitor comprising:
a conductive storage node plate comprising a rectangular upper portion and a lower portion that extends downward and makes contact at a storage node junction, said storage node plate conforms to an existing topology of said silicon substrate;

a cell dielectric adjacent and coextensive said storage node plate except at said storage node junction contact; and conductive double cell plates adjacent and coextensive said cell dielectric.

2. A DRAM storage capacitor constructed on a silicon substrate, said capacitor comprising:

a first conductive layer, said first conductive layer patterned to form a storage node plate having an upper rectangular shaped portion and a lower portion that extends downward and makes contact at a storage node junction, said storage node plate conforms to an existing topology of said silicon substrate;

a second conductive layer, said second conductive layer patterned to form a rectangular shaped bottom cell plate of a double cell plate;

a cell dielectric layer being adjacent said storage node plate and said bottom cell plate and coextensive therewith except at a region for said contact at said storage node junction; and a third conductive layer forming a top cell plate of said double cell plate, said top plate connecting to said bottom cell plate to form a double cell plate, said double cell plate being adjacent said second cell dielectric layer and coextensive therewith.

3. The capacitor of claim 2, wherein said first, said second and said third conductive layers are selected from the group consisting essentially of tungsten or tungsten silicide.

4. A DRAM memory array constructed on a silicon substrate, said memory array comprising:

a plurality of active areas arranged in parallel interdigitated rows and parallel non-interdigitated columns, said active areas separated by isolation means, each of said active areas having a digit line junction, and a storage node junction;

a plurality of parallel conductive word lines aligned along said rows such that a digit line junction and a storage node junction within each active area are bridged by a word line, each word line being insulated from associated active areas by a gate dielectric layer;

a plurality of parallel conductive digit lines, aligned along said columns such that a digit line makes electrical contact with each digit line junction within a column, said digit lines running perpendicular to and over said word lines forming a 3-dimensional, waveform-like topology, said digit and word lines electrically separated from one another by isolation means; and at least one storage capacitor for each active area, each capacitor having a storage node plate that is in electrical contact with its associated active area and a double cell plate that is common to the entire array, each storage node plate being insulated from said double cell plate by a cell dielectric layer.

5. The memory array of claim 4, wherein said capacitor comprises:

a first conductive layer, said first conductive layer patterned to form a storage node plate having an upper rectangular shaped portion and a lower portion that extends downward and makes contact at a storage node junction, said storage node plate conforms to an existing topology of said silicon substrate;

a second conductive layer, said second conductive layer patterned to form a rectangular shaped bottom cell plate of a double cell plate;

a cell dielectric layer being adjacent said storage node plate and said bottom cell plate and coextensive therewith except at a region for said contact at said storage node junction; and a third conductive layer forming a top cell plate of said double cell plate, said top plate connecting to said bottom cell plate to form a double cell plate, said double cell plate being adjacent said second cell dielectric layer and coextensive therewith.

6. The capacitor of claim 4, wherein said first, said second and said third conductive layers are selected from the group consisting essentially of tungsten or tungsten silicide.

7. A process for fabricating a DRAM array on a silicon substrate, said process comprising the following sequence of steps:

creating a plurality of separately isolated active areas arranged in parallel interdigitated rows and parallel non-interdigitated columns;

creating a gate dielectric layer on top of each active area;

depositing a first conductive layer superjacent surface of said array;

depositing a first dielectric layer superjacent said first conductive layer;

masking and etching said first conductive and said first dielectric layers to form a plurality of parallel conductive word lines aligned along said rows such that each said word line passes over an inner portion of each said active area being separated therefrom by a remanent of said gate dielectric layer;

creating of a conductively-doped digit line junction and storage node junction within each said active area on opposite sides of each said word line;

depositing a second dielectric layer superjacent said array surface;

creating a first aligned buried contact location at each said digit line junction in each said active area;

depositing a second conductive layer superjacent said array surface, said second conductive layer making direct contact to said digit line junctions at said first buried contact locations;

depositing a third dielectric layer superjacent to said second conductive layer;

masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

depositing a fourth dielectric layer on surface of said silicon;

masking and etching a buried contact location allowing access to an active area and thereby forming vertical sidewalls within opening of said buried contact location;

depositing a third conductive layer superjacent said fourth dielectric layer and said buried contact opening;

planarizing said third conductive layer;

patterning said third conductive layer to form an upper rectangular shaped portion and a lower portion of a storage node, said lower portion making contact to said active area at said buried contact location, said third conductive layer conforming to said 3-dimensional, waveform shaped topology;

depositing a fifth dielectric layer superjacent said existing waveform shaped topology;

anisotropically etching said fifth dielectric layer thereby forming vertical dielectric spacers adjacent sidewalls of said conductive upper rectangular shaped portion;

depositing and planarizing a fourth conductive layer superjacent said existing waveform shaped topology;

isotropically etching said vertical dielectric spacers thereby leaving a conductive rectangular shaped bottom cell plate;

depositing a cell dielectric layer superjacent said existing waveform shaped topology, thereby enclosing exposed portion of said bottom cell plate and upper portion of said storage node plate;

depositing a fifth conductive layer superjacent said cell dielectric layer, thereby forming a top cell plate, said top cell plate connecting to said bottom cell plate, said top and said bottom cell plates combining to form a double cell plate common to the entire memory array.

8. A process as recited in claim 7, wherein said gate dielectric layer is oxide.

9. A process as recited in claim 7, wherein said first and said second conductive layers comprise a layer of tungsten silicide and a layer of conductively-doped polysilicon.

10. A process as recited in claim 7, wherein said first and said second dielectric layers are selected from the group consisting essentially of oxide or nitride.

11. A process as recited in claim 7, wherein said third dielectric layer is selected from the group consisting essentially of oxide or nitride.

12. A process as recited in claim 7, wherein said third, said fourth and said fifth conductive layers are selected from the group consisting essentially of tungsten or tungsten silicide.

13. A process as recited in claim 7, wherein said second, said third dielectric layers and said cell dielectric layers are deposited by chemical vapor deposition.

14. A process as recited in claim 7, wherein said third dielectric layer is selected from the group consisting essentially of oxide, nitride or polyimide.

15. A process as recited in claim 7, wherein said isotropically etching said vertical dielectric spacers is a time controlled etch.

16. A process as recited in claim 7, wherein said cell dielectric layer is a PZT ferroelectric material.

17. A process as recited in claim 16, wherein said PZT ferroelectric material is applied by a sol-gel method.

18. A process for fabricating a DRAM storage capacitor on a silicon substrate having active areas, word lines and digit lines, said process comprising the following sequence of steps:

depositing a first dielectric layer on surface of said silicon;

masking and etching a buried contact location allowing access to an active area and thereby forming vertical sidewalls within opening of said buried contact location;

depositing a first conductive layer superjacent said first dielectric layer and said buried contact opening;

planarizing said first conductive layer;

patterning said first conductive layer to form an upper rectangular shaped portion and a lower portion of a storage node, said lower portion making contact to said active area at said buried contact location, said first conductive layer conforming to said 3-dimensional, waveform shaped topology;

depositing a second dielectric layer superjacent said existing waveform shaped topology;

anisotropically etching said second dielectric layer thereby forming vertical dielectric spacers adjacent sidewalls of said conductive upper rectangular shaped portion;

depositing and planarizing a second conductive layer superjacent said existing waveform shaped topology;

isotropically etching said vertical dielectric spacers thereby leaving a conductive rectangular shaped bottom cell plate;

depositing a cell dielectric layer superjacent said existing waveform shaped topology, thereby enclosing exposed portion of said bottom cell plate and upper portion of said storage node plate;

depositing a third conductive layer superjacent said cell dielectric layer, thereby forming a top cell plate, said top cell plate connecting to said bottom cell plate, said top and said bottom cell plates combining to form a double cell plate common to the entire memory array.

19. A process as recited in claim 18, wherein said first dielectric layer is selected from the group consisting essentially of oxide or nitride.

20. A process as recited in claim 18, wherein said first, said second and said third conductive layers are selected from the group consisting essentially of tungsten or tungsten silicide.

21. A process as recited in claim 18, wherein said first, said second dielectric layers and said cell dielectric layers are deposited by chemical vapor deposition.

22. A process as recited in claim 18, wherein said first dielectric layer is selected from the group consisting essentially of oxide, nitride or polyimide.

23. A process as recited in claim 18, wherein said isotropically etching said vertical dielectric spacers is a time controlled etch.

24. A process as recited in claim 18, wherein said cell dielectric layer is a PZT ferroelectric material.

25. A process as recited in claim 24, wherein said PZT ferroelectric material is applied by a sol-gel method.

* * * * *